(12) United States Patent
Bogus et al.

(10) Patent No.: US 10,128,783 B2
(45) Date of Patent: Nov. 13, 2018

(54) SYNCHRONIZATION OF INTERNAL OSCILLATORS OF COMPONENTS SHARING A COMMUNICATIONS BUS

(71) Applicant: Infineon Technologies AG, Neubiberg (DE)

(72) Inventors: Matthias Bogus, Munich (DE); Christian Heiling, Graz (AT); Ljudmil Anastasov, Munich (DE); Benno Koeppl, Markt Indersdorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/169,540

(22) Filed: May 31, 2016

(65) Prior Publication Data

US 2017/0346419 A1 Nov. 30, 2017

(51) Int. Cl.
| | | |
|---|---|---|
| *G05B 11/28* | (2006.01) | |
| *H02P 6/10* | (2006.01) | |
| *G06F 13/40* | (2006.01) | |
| *G06F 13/42* | (2006.01) | |
| *H03K 17/687* | (2006.01) | |

(Continued)

(52) U.S. Cl.
CPC ............ *H02P 6/10* (2013.01); *G06F 13/4022* (2013.01); *G06F 13/4291* (2013.01); *H03K 17/0822* (2013.01); *H03K 17/18* (2013.01); *H03K 17/687* (2013.01)

(58) Field of Classification Search
CPC ........ G09G 5/006; G09G 5/18; G09G 3/3611; G09G 2320/0257; G09G 2330/04; H03L 7/06; H03L 7/085; H03L 7/091; H03L 7/07; H03L 7/087; H03L 2207/08; H03L 7/08; H03L 7/081; H03L 7/0812; H03L 7/0991; H02P 1/00; H02P 3/00; H02P 6/00; H02P 6/10; H02P 41/00; H02P 21/00; H02P 27/04; H02P 6/06; H02P 5/46; H02P 1/46; H02P 3/18; H02P 5/00; H03K 17/687; H02K 19/00; H02K 19/02; H02K 19/12; H02K 21/00; G05B 11/28
USPC .... 318/400.01, 400.02, 400.14, 400.15, 621, 318/625, 47, 73, 74, 85, 115, 119, 700, 318/701, 727, 799, 801, 400.1, 599, 811, 318/400.05, 705; 361/203; 375/145, 375/149; 324/436, 442, 236; 327/182, 327/191
See application file for complete search history.

(56) References Cited

U.S. PATENT DOCUMENTS 3,718,846 A * 2/1973 Bejach ................. H02P 5/56
                                                                        318/78
4,466,110 A * 8/1984 Kizaki ................. H04L 7/0083
                                                                        327/18

(Continued)

*Primary Examiner* — Antony M Paul
(74) *Attorney, Agent, or Firm* — Slater Matsil, LLP

(57) ABSTRACT

A drive circuit includes an internal oscillator and a pre-drive controller coupled to the internal oscillator. The pre-drive controller can have a switch control output configured to be coupled to a switch input. The pre-drive controller can receive switch control data, receive a clock signal, receive a synchronization signal, synchronize the internal oscillator based on the clock signal and the synchronization signal, and generate a pulse modulated switching signal at the switch control output based on the switch control data and the internal oscillator.

30 Claims, 9 Drawing Sheets

(51) Int. Cl.
*H03K 17/082* (2006.01)
*H03K 17/18* (2006.01)

(56) References Cited

U.S. PATENT DOCUMENTS

| | | | | |
|---|---|---|---|---|
| 4,974,081 A * | 11/1990 | Yokogawa | H04N 5/12 | 348/542 |
| 5,821,826 A * | 10/1998 | Newlin | H03K 3/0231 | 331/113 A |
| 5,969,631 A * | 10/1999 | Ammler | H04L 25/4902 | 340/3.21 |
| 6,154,246 A * | 11/2000 | Ogasawara | G06K 15/1219 | 347/247 |
| 6,370,651 B1 * | 4/2002 | Durante | G11C 16/32 | 713/322 |
| 6,525,720 B1 * | 2/2003 | Baek | G09G 5/006 | 345/211 |
| RE38,045 E * | 3/2003 | Cometti | G06F 1/10 | 327/156 |
| 6,538,516 B2 * | 3/2003 | Lenk | H03L 7/07 | 331/1 A |
| 6,636,122 B2 * | 10/2003 | Tsyrganovich | H03D 13/001 | 327/160 |
| 6,687,555 B1 * | 2/2004 | Honda | G05B 11/28 | 341/155 |
| 6,831,634 B1 * | 12/2004 | Shigeta | H04L 12/40117 | 345/211 |
| 6,958,658 B2 * | 10/2005 | Shah | H03K 3/0315 | 331/1 A |
| 7,002,415 B2 * | 2/2006 | Tsyrganovich | H03D 13/001 | 327/156 |
| 7,046,057 B1 * | 5/2006 | Culler | H03L 7/081 | 327/156 |
| 7,091,795 B1 * | 8/2006 | Tsyrganovich | H03L 7/085 | 327/156 |
| 7,235,958 B2 * | 6/2007 | Brassfield | H02J 1/102 | 323/267 |
| 7,633,498 B2 * | 12/2009 | Kang | G09G 3/3611 | 345/213 |
| 7,724,100 B2 * | 5/2010 | Gong | H03K 3/0231 | 327/175 |
| 7,809,025 B2 * | 10/2010 | Arumugham | G06F 1/12 | 370/503 |
| 7,860,609 B2 * | 12/2010 | Yanagita | B25J 9/1669 | 700/212 |
| 7,864,906 B2 * | 1/2011 | Ma | H04L 7/042 | 375/354 |
| 7,936,637 B2 * | 5/2011 | Shori | G11C 7/1006 | 365/233.1 |
| 8,174,200 B2 * | 5/2012 | Kosaka | H05B 41/2827 | 315/209 PZ |
| 8,179,088 B2 * | 5/2012 | Takaishi | G06K 7/0008 | 320/107 |
| 8,416,233 B2 * | 4/2013 | Kang | G09G 3/3611 | 345/100 |
| 8,536,911 B1 * | 9/2013 | Nakamuta | H03L 7/087 | 327/147 |
| 8,559,263 B2 * | 10/2013 | Shori | G11C 7/1006 | 365/233.1 |
| 8,681,271 B2 * | 3/2014 | Iwaki | H04N 5/06 | 348/500 |
| 8,729,841 B2 * | 5/2014 | Reynolds | H02P 6/14 | 318/400.09 |
| 9,015,508 B2 * | 4/2015 | Yoshida | G06F 15/78 | 327/156 |
| 2004/0189406 A1 * | 9/2004 | Shah | H03K 3/0315 | 331/57 |
| 2005/0110784 A1 * | 5/2005 | Kang | G09G 3/3611 | 345/204 |
| 2006/0132651 A1 * | 6/2006 | Matsushima | H04N 5/0736 | 348/513 |
| 2006/0153008 A1 * | 7/2006 | Miyamatsu | G05B 19/05 | 368/47 |
| 2006/0188307 A1 * | 8/2006 | Inui | G03G 15/652 | 399/396 |
| 2006/0261798 A1 * | 11/2006 | Brassfield | H02J 1/102 | 323/351 |
| 2006/0287769 A1 * | 12/2006 | Yanagita | B25J 9/1669 | 700/245 |
| 2007/0159221 A1 * | 7/2007 | Ma | H04L 7/042 | 327/141 |
| 2008/0080566 A1 * | 4/2008 | Arumugham | G06F 1/12 | 370/503 |
| 2008/0180151 A1 * | 7/2008 | Gong | H03K 3/0231 | 327/175 |
| 2009/0147903 A1 * | 6/2009 | Kikuchi | H03L 7/07 | 375/376 |
| 2009/0323457 A1 * | 12/2009 | Shori | G11C 7/1006 | 365/233.1 |
| 2010/0001847 A1 * | 1/2010 | Takaishi | G06K 7/0008 | 340/10.34 |
| 2010/0045656 A1 * | 2/2010 | Kang | G09G 3/3611 | 345/213 |
| 2010/0188011 A1 * | 7/2010 | Kosaka | H05B 41/2827 | 315/276 |
| 2011/0204946 A1 * | 8/2011 | Shori | G11C 7/1006 | 327/160 |
| 2013/0045023 A1 * | 2/2013 | Kosaka | G03G 15/80 | 399/88 |
| 2013/0271656 A1 * | 10/2013 | Iwaki | H04N 5/06 | 348/515 |
| 2017/0250634 A1 * | 8/2017 | Ambruson | H02P 6/17 | |

* cited by examiner

SYNCHRONIZATION OF INTERNAL OSCILLATORS OF COMPONENTS SHARING A COMMUNICATIONS BUS

TECHNICAL FIELD

This disclosure in general relates to the synchronization of internal oscillators of components, in particular to synchronization of internal oscillators to an external clock reference.

BACKGROUND

A motor driver can have a controller that generates a pulse-width modulated signal used to produce drive signals for driver switches for different phases of a motor. The pulse-width modulated signal can specify the drive parameters for the motor. The pulse-width modulated signal can be generated based in-part on an internal oscillator of a component. This arrangement is suitable where there is one motor in control.

In applications employing redundancy of motors or motor windings where multiple pulse-width modulated signals are used to specify the drive parameters for the redundant windings or motors, if the pulse-width modulated signals are not synchronized torque ripple, vibration, noise, harshness, or the like can result. In some cases, the internal oscillators of multiple drive components, on which a pulse-width modulated signal is based, can have manufacturing tolerances that can cause two different oscillators to have different frequencies.

A way of synchronizing the internal oscillators is needed so that the corresponding pulse-width modulated signals are also synchronized in order to synchronize control of redundant motor systems.

SUMMARY

Embodiments include a drive circuit with an internal oscillator and a pre-drive controller coupled to the internal oscillator. The pre-drive controller can have a switch control output configured to be coupled to a switch input. The pre-drive controller can receive switch control data, receive an external clock reference, receive a synchronization signal, synchronize the internal oscillator based on the clock reference and the synchronization signal, and generate a pulse modulated switching signal at the switch control output based on the switch control data and the internal oscillator.

Embodiments include a method that includes receiving switch control data, receiving an external clock reference, receiving a synchronization signal, synchronizing an internal oscillator based on the clock reference and the synchronization signal, generating a pulse modulated switching signal based on the switch control data and the internal oscillator, and providing the pulse modulated switching signal to a switch.

Embodiments include a system having pre-driver controllers. Each of the pre-driver controllers includes an internal oscillator, an interface for a clock reference, an interface for a synchronization signal, and an interface for a data signal. The data signal interface is configured to receive switch control data. Each of the pre-driver controllers are configured to generate a pulse-modulated signal based on the switch control data and the internal oscillator and to synchronize the internal oscillator based on the clock reference and the synchronization signal.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION OF ILLUSTRATIVE EMBODIMENTS

Figure 1:
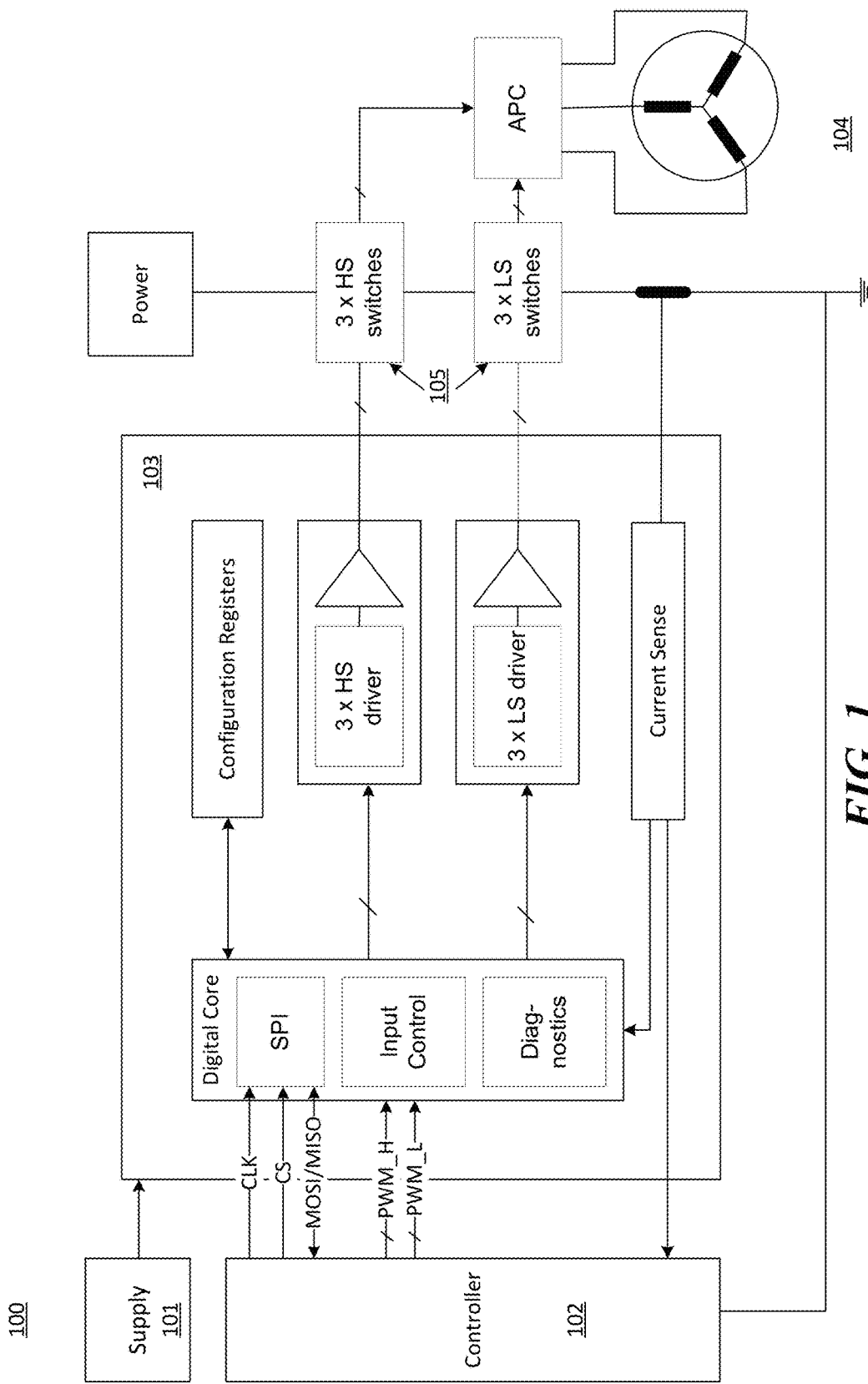
FIG. 1 illustrates a three-phase motor drive controller circuit.

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

A motor control system may include a microprocessor or microcontroller that controls one or more half-bridge drivers to drive switches to provide power to a motor. For example, a three-phase DC motor is controlled by three pulse-width modulated signals provided to three switches. As the switches open or close, power is controlled from a DC rail to a corresponding winding for each phase. The microprocessor or microcontroller receives electrical feedback information from the motor which it uses to determine how the duty cycle of the pulse-width modulated signal should be varied for each of the windings of the motor. The microprocessor or microcontroller can take as another input some directive indicating how the motor speed should be changed, e.g., a command to speed up or slow down the motor and use that directive to also adjust the pulse-width modulated signals to the windings of the motor.

In some embodiments, pre-driver controllers can integrate multiple half-bridge drivers. In some embodiments, half-bridge drivers can be individual but chained together to a microcontroller through a data bus. Control signals can be sent over the data bus.

Embodiments include a motor control system that, in addition to controlling a first set of windings of a motor, also controls a second set of windings. The second set of windings can be in the motor or in a second motor. For example, a three-phase motor may have backup windings integrated either in phase or out of phase with the existing windings, or an additional motor (and its windings) may be added to the system. Control for the second set of windings is also added. The microprocessor or microcontroller is configured to determine duty-cycle information for a pulse-width modulated switching signal sent to each of a corresponding switch for switching power to each one of the windings. The duty-cycle information can be digitized and sent to a pre-driver integrated circuit ("IC") having three half-bridge drivers. The pre-driver IC is a switch controller and is configured to produce a pulse modulated signal (such as a pulse-width modulated ("PWM") signal) to be provided as a switching signal to a switch (such as a FET).

In embodiments, an internal oscillator for a pre-driver IC or for each of the half-bridge drivers can be synchronized to an external clock reference. The external clock reference can be provided by a data bus (e.g., the clock signal of an SPI bus) or, in some embodiments, the external clock reference can be an independent or dedicated clock reference. The internal oscillators of the pre-driver IC or half-bridge drivers are used to generate the PWM signals to the switches that control power to the motor windings. The internal oscillators of these devices can, over time, become out of phase with one another because their frequencies will slightly vary due to differences in temperature and manufacturing tolerances. For example, the internal oscillator can be an RC oscillator using a combination of resistors and oscillators. The resistance value of resistors will typically change based on temperature which can cause a change in frequency of the RC oscillator as the temperature of the resistors change in operation. In embodiments, a pulse modulated signal is generated, in part, on the internal oscillator. Synchronizing the internal oscillators of the half-bridge drivers can allow the timing of the energizing of the windings of the motors to occur at their intended relative moments, which would reduce the chance of vibration, torque ripple, shuddering, and such that may be caused by the windings being energized at times slightly off from an intended relative time. In other words, if the internal oscillators were too far out of phase with one another, then the energizing of one of the windings can momentarily fight against the energizing of another one of the windings. Also, if the internal oscillators were too far out of phase with one another, current measurement timing can be off and affect the duty cycle calculation. Embodiments can synchronize the internal oscillators to an external reference signal so that they are brought back into phase (or near to it) with one another. Synchronization can occur periodically, in response to a synchronization command, or in response to sensor input.

In embodiments where a the half-bridge drivers are individual and not integrated into a pre-driver IC, synchronization of the internal oscillators of the half-bridge drivers is needed regardless of whether a redundant motor or motor windings are present. In a system with a pre-driver IC, each of the integrated half-bridge drivers can base their signals on the same internal oscillator, so additional synchronization is not needed unless multiple pre-driver ICs are in use for a redundant system.

In embodiments, a synchronization signal can be provided to each of the half-bridge drivers. A delay for each of the half-bridge drivers can be calculated based on the synchronization signal and the clock reference signal. When synchronization occurs, for example, in response to a command or sensor input or at a periodic interval, the synchronization signal can be used as a trigger to start the synchronization. Synchronization can be accomplished, for example, based on the calculated delay or by a phase locked loop. For example, start of synchronization can be signaled by a digital command received over the data bus, the digital command containing a data format understood by the half-bridge drivers as signifying the start of synchronization. A clock reference signal can be taken from an external reference clock, a clock signal included in the data bus interface, or by clock reconstruction out of properly encoded data (such as from data on a data bus without a dedicated clock signal). Synchronization of the internal oscillators to the clock reference signal can be accomplished by a digital phase-locked-loop, frequency lock loop, approximation, proportional-integral-derivative controller (PID controller), or other available means.

In addition to the synchronization aspects, in accordance with embodiments, a switch data controller can determine duty cycle information for each of a high side and low side driver of a half-bridge driver for each phase of the windings. The duty cycle information can be sent to a half-bridge driver for each of the windings. The duty cycle information can be a digital representation of a pulse modulated signal, such as a frequency or width setting. This switch control data can be received by a controller (half-bridge driver) and a pulse modulated signal (such as a PWM signal) can be generated based on an internal clock of the half-bridge driver and the switch control data. The pulse modulated signal can be sent to a switch to control power to a motor winding. Three half-bridge drivers can be integrated into a single pre-driver drive circuit or the three half-bridge drivers for three windings can remain singular. A system with six windings can have a half-bridge driver associated with each of the windings. The half-bridge driver controllers can receive feedback information from a current sense for each of the half-bridge switches FET. The half-bridge drivers can digitize the current information and send the feedback to the switch data controller.

One of skill in the art will understand that, although the embodiments may relate to a three-phase DC motor, such as a three-phase brushless motor, embodiments are not limited as such. One of skill can apply the techniques described herein to other motor technologies or to other switching technologies using half-bridges (such as synchronous buck converters, resonant converters, electronic ballasts, induction heating, and motion control) without undue experimentation. One of skill can also apply the techniques described herein to systems with a different number of phases, such as two, four, or five phase systems or to systems with multiple phases per system. For example, in embodiments with pre-driver ICs having integrated half-bridge drivers, the number of integrated drivers can be increased or decreased in each pre-driver IC. In embodiments with individual half-bridge drivers, the number of half-bridge drivers in each chain can be increased or decreased.

FIG. 1 illustrates a three-phase motor drive controller circuit 100. Circuit 100, for example, can be used to operate an electronic power steering system in an automobile. Circuit 100 includes several modules, including a supply IC 101, controller 102, pre-driver IC 103, and field effect transistors ("FETs") 105. FETs 105 are the high side and low side FETs for controlling phase-by-phase power to three phase motor 104, with one high side and one low side FET for each phase. Pre-driver IC 103 has several logical blocks inside, such as a digital core block containing a serial peripheral interface ("SPI") bus interface, input control logic, and diagnostic functions. A current sense block provides feedback information from the motor through the pre-driver IC 103 and back to controller 102. Configuration registers allow configuration of configurable settings in pre-driver IC 103. The digital core produces two PWM signals (for the high side and low side FET) for each of the three phases, totaling six PWM switching signals provided by way of three half-bridge drivers, a high side ("HS") and low side ("LS") driver for each half-bridge driver. One of skill would understand that other connections and functions can exist within the diagram of FIG. 1.

In circuit 100, controller 102 provides motor control via pulse width modulated signals PWM_H and PWM_L based on feedback from Current Sense of pre-driver IC 103. Controller 102 can also operate as the bus master for the SPI bus. In an operation, controller 102 receives input that determines a desired speed and direction to operate motor 104. The input on which the PWM signals are based can be, for example, an input telling controller 102 to speed up the motor, slow down the motor, stop the motor, reverse direction of the motor, set the speed of the motor to a particular speed and direction, and so forth. For example, in the system of FIG. 1, the input can be determined from a position sensor on a steering wheel shaft. PWM signals are created by controller 102 based on the input and based on the current condition and state of the motor, the PWM signals being created to change the state of the motor from a first state to a second state, where the second state is a state that is closer to a targeted state of the motor.

Figure 2:
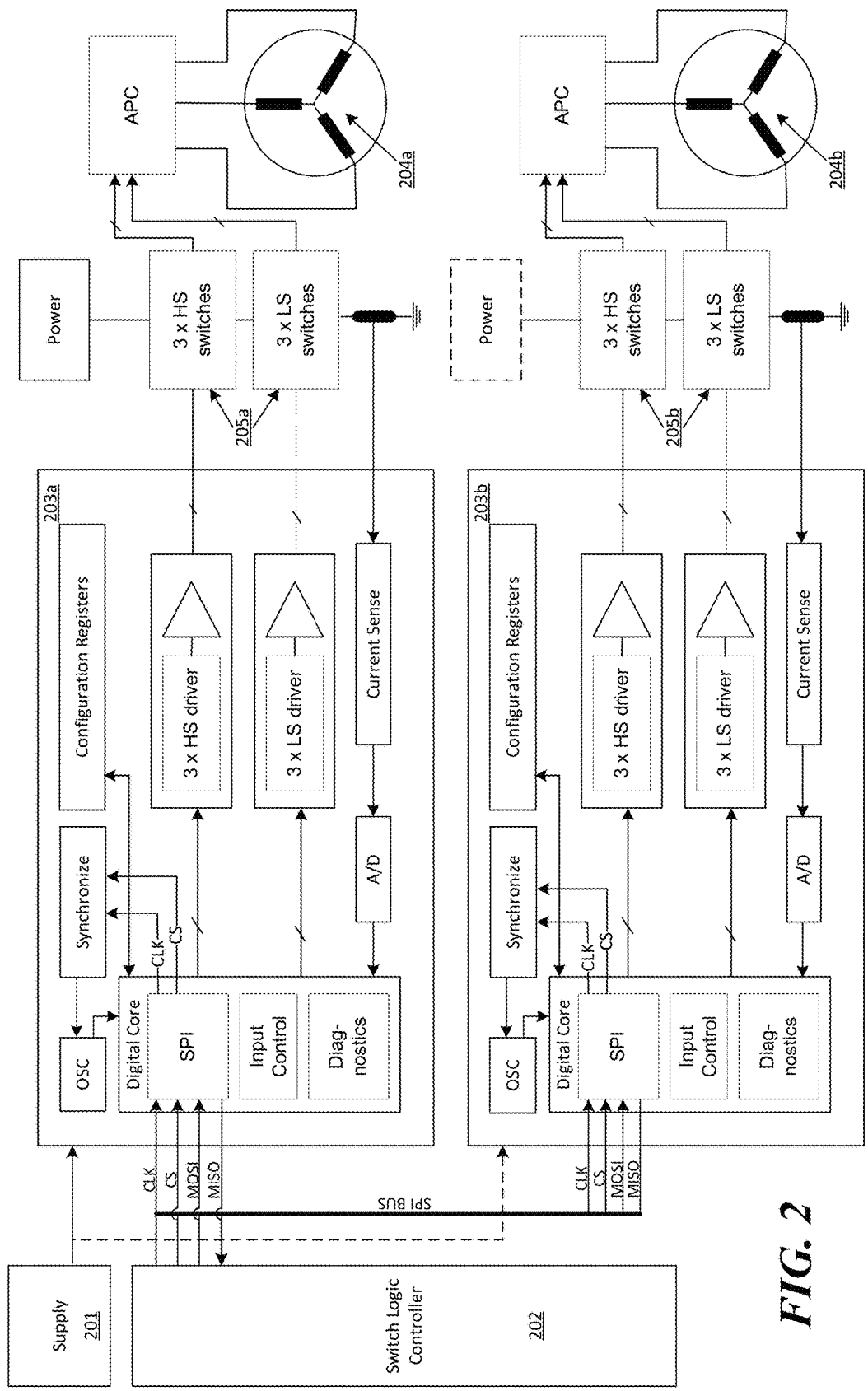
FIG. 2 illustrates a system in accordance with one embodiment.

It may be desirable to make a system such as the system illustrated in FIG. 1 more fault tolerant or robust. FIG. 2 illustrates a system in accordance with one embodiment. System 200 of FIG. 2 has a doubling of some components found in FIG. 1. Supply IC 201 is comparable to Supply IC 101 of FIG. 1. Controller 202 is comparable to Controller 102 of FIG. 1. Pre-drivers 203a and 203b are comparable to pre-driver 103 of FIG. 1, except as described below. Motors with windings 204a and 204b are comparable to motor windings 104 of FIG. 1. FETS 205a and 205b are comparable to FETS 105 of FIG. 1. As can be seen in FIG. 2, Supply IC 201 and microcontroller 202 are not duplicated, however two pre-drivers 203a and 203b, two motors 204a and 204b, and two sets of FETS 205a and 205b are duplicated. An alternative arrangement (not pictured) can, rather than have two separate motors, combine the windings of motor 204b into motor 204a.

Rather than generate a pulse modulated signal in controller 202 (as was done with the PWM signals of controller 102), pulse signal generation has been moved to pre-driver ICs 203a and 203b. Pre-drivers 203a and 203b internally contain 3 half-bridge drivers for high side and low side drivers out to FETS 205a and 205b respectively. Switch logic controller 202 determines the duty cycle and pulse signal characteristics, such as width or frequency, and sends the duty cycle information as switch control data to each of the pre-driver ICs 203a and 203b over a communications bus, such as an SPI communications bus. This will be discussed in further detail below.

Feedback information from the motors 204a and 204b can be provided to the microcontroller respectively via the pre-driver ICs 203a and 203b. The feedback information from each of the motors goes through an analog to digital conversion prior to being provided to the microcontroller through the communications bus. Digitizing feedback to microcontroller 202 allows a significant reduction in pin count and wire density in the system.

However, unless the pulse modulated signals are synchronized in pre-driver ICs 203a and 203b, torque ripple, vibration, noise, harshness, or the like can occur. Because pulse modulated motor control is based on an internal oscillator, synchronizing the internal oscillators can allow the generation of pulse modulated signals to occur effectively based on a common oscillator. Without synchronization of the internal oscillators of pre-driver ICs 203a and 203b, there is a possibility that the internal oscillators will fall out of phase with one another at least due to differences in their oscillator frequencies. Differences in manufacturing and operating temperature can affect the rate of the internal oscillators.

Internal oscillators in the pre-driver ICs can be synchronized using a variety of methods. For example, a dedicated clock signal (not shown) can be provided from the microcontroller to the pre-driver ICs 203a and 203b. Pre-driver ICs 203a and 203b can be configured to base the pulse modulated signal on the dedicated clock from the microcontroller. For example, the internal oscillators of the pre-driver ICs 203a and 203b can be synchronized to the dedicated clock and the pulse modulated signal can be based on the internal oscillators.

Rather than use a dedicated clock signal, embodiments can use the clock signal of the SPI bus as a basis for synchronization. As applied to embodiments in accordance with FIG. 2, the SPI bus clock signal routes to the SPI interface in pre-driver ICs 203a and 203b. The SPI bus is used to transmit switch control information to pre-driver ICs 203a and 203b and receive diagnostic and sensor data feedback from pre-driver ICs 203a and 203b. In some embodiments, controller 202 can have two SPI busses, one for each pre-driver IC. In some embodiments, the SPI busses can be daisy chained together, such that data is transmitted from the controller to pre-driver IC 203a then to pre-driver IC 203b, then back to controller 202. In some embodiments, the SPI busses can be wired in parallel and multiple chip select outputs from controller 202 can select which chip should receive or send data.

Synchronization can occur when a particular set of conditions are met. In some embodiments, synchronization can occur based on sensor input. In some embodiments, synchronization can occur based on a particular data sequence or data type sent by controller 202. If two SPI busses are used, then synchronization can occur as described below with respect to FIG. 8.

In some embodiments, a dedicated data sequence can be used to trigger the oscillators of pre-driver ICs 203a and 203b to be synchronized on the next falling edge of the chip select signal. For example, a data sequence can be received by the pre-drivers. The data sequence can be recognized as a predetermined type of data sequence causing the oscillators to be synchronized. Each pre-driver can determine appropriate tuning settings to apply to the internal oscillator based on the external reference clock. As part of the normal SPI data transmission sequencing, the chip select line will go high and then low. Since the chip select line is wired so that both the pre-drivers receive the same signal at the same time, it can be used to trigger when the internal oscillators should be synchronized, for example on the rising edge or falling edge of the chip select signal. In this way the chip select can be considered a synchronization signal when synchronization is set to occur. In embodiments where multiple chip select signals are used, each of the chip select signals can be driven high and then low simultaneously.

In some embodiments, synchronization can be achieved by using the SPI clock signal as a basis for the internal oscillator, and forcing each of the internal oscillators to the same phase based on the SPI clock signal. For example, when the chip select signal of the SPI bus transitions to low following a sequence indicating synchronization should occur, a synchronization algorithm can be used to synchronize an internal oscillator with an external clock reference. A person of ordinary skill can perform such synchronization.

For example, a digital phase-locked-loop, frequency lock loop, or approximation can be used for synchronization.

A phase locked loop is a negative feedback system where an oscillator-generated signal (such as the internal oscillators) is phase and/or frequency locked to a reference signal (such as the external clock reference). In some embodiments, a phase locked loop can be based on a charge-pump design including a phase-frequency detector, charge-pump, low-pass filter, voltage-controlled oscillator, level-shifter, feedback divider, and voltage regulator/filter. In some embodiments, a phase locked loop can be a digital phase locked loop. Successive approximation is an approximation scheme common in the industry. For example, where the SPI clock signal may be at a lesser frequency than an internal oscillator of the pre-driver ICs, a successive approximation algorithm can be used to synchronize the internal oscillator to the slower external oscillator. In some embodiments, proportional-integral-derivative controller (PID controller) can be integrated into the half-bridge driver to provide a control loop feedback mechanism to compare the desired setpoint (external clock reference) to a measured process variable (internal oscillator) and calculate an error value and adjust a control variable of the internal oscillator (such as a resistance) to minimize the error value. Other types of synchronization algorithms can also be used.

In some embodiments, synchronization can be achieved by offsetting the internal oscillators at an agreed upon moment or at an agreed upon signal. In some embodiments, the chip select signal can be used as a signal to synchronize the oscillators in the pre-driver ICs. For example, the two pre-driver ICs can agree to synchronize their internal oscillators after every so many chip select signal transitions, i.e., on the rising or falling edge of the chip select signal. For example, after every third falling edge of the chip select signal, synchronize the internal oscillators.

In some embodiments, instead of an SPI bus, another communications or data bus can be used. The communications bus can have a data in conductor, a data out conductor, a clock signal, and a bus control signal. In some embodiments, the conductors can be combined and modulated as one of skill in the art would understand. In some embodiments, the clock rate can be determined based on a communications standard and derived from the data. Some embodiments do not require a bus control signal, and can use a separate synchronization signal as a separate output of the microcontroller to a separate input of the pre-drivers, not directly relating to the operation of the data bus.

When the internal oscillators of pre-driver ICs 203*a* and 203*b* are synchronized, they will return to a phase difference of zero (or practically zero). Immediately after synchronization, the phases of the internal oscillators may begin to drift from one another, requiring a further synchronization at a future point to return the phase difference to zero.

One of skill in the art will understand that controller 202 can be a microcontroller, field-gate programmable array (FPGA), microprocessor, and so forth. Pre-drivers 203*a* and 203*b* can be provided on a substrate, alone or together, along with other components.

Figure 3:
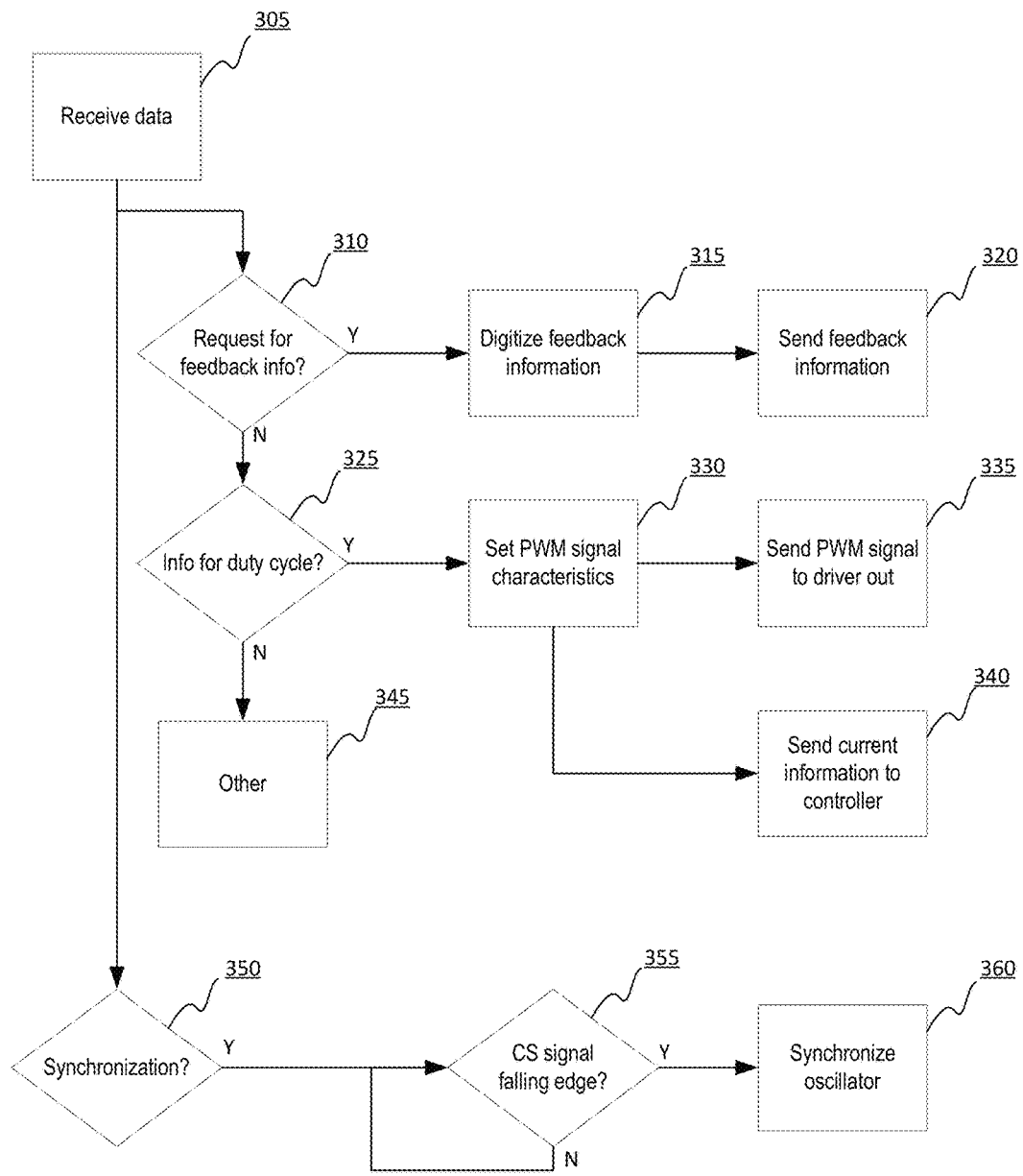
FIG. 3 illustrates the flow of operation at a pre-driver IC, in accordance with some embodiments.

FIG. 3 illustrates the flow of operation at the pre-driver IC. At step 305, the pre-driver IC receives data on the SPI bus. Not shown, but in a daisy chained implementation, the pre-driver IC immediately sends the data on to the next SPI device. At step 310, the data is examined to determine what it conveys to the pre-driver IC. For example, whether it is a request for feedback information, such as diagnostic information, temperature or other sensor information for the high side or low side driver, current flow information, position sensing information, and so forth. At step 315, if the data is a request for information, the feedback information is digitized and, at step 320, sent back to the switch logic controller. If the data was not a request for feedback information at step 310, then at step 325, the flow determines whether the data is duty cycle information for the pre-driver ICs. If so, at step 330, the duty cycle information is used to set the pulse width modulated signal characteristics. At step 335, the pulse width modulated signals for the high side and low side drivers are sent. At step 340, confirmation or other information can be sent to the controller 202. If the data was not duty cycle information at step 325, then flow may continue to step 340. Other types of data can be integrated into the system and used or processed at step 340. For example, other types of data could include data from other pre-driver ICs or configuration information for setting parameters of the pre-driver IC.

At step 350, the flow determines whether synchronization should occur. For example, in some embodiments when the data received is a particular format or data type, the pre-driver ICs are signaled to synchronize their internal oscillators on the next rising or falling of the chip select signal. If synchronization is signaled, at step 355 the pre-driver IC can wait until a falling edge of the chip select signal. If the falling edge is detected, at step 360 the pre-driver ICs can synchronize the internal oscillators to the reference clock signal of the SPI bus. It should be understood that the system could be configured to use the chip select signal's rising edge instead. Also, instead of using the chip select signal, a separate synchronization signal could be used to trigger synchronization.

Figure 4:
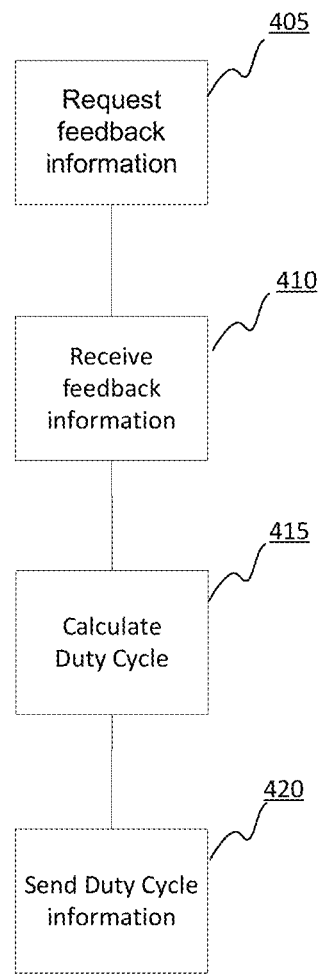
FIG. 4 illustrates the flow of operation at a controller, in accordance with some embodiments.

FIG. 4 illustrates the flow of operation at a switch logic controller, such as controller 202. At step 405, the controller will send a communication packet on the SPI bus requesting feedback information from the pre-driver ICs. For example, the request can be a request for temperature information, current sense information, DC position information, diagnostic information, and so forth. At step 410, the controller will receive the information requested. Steps 405 and 410 can repeat, for example, to obtain readings from multiple of the pre-driver ICs or of multiple different types of data. At step 415, the controller calculates the duty cycle as switch control data for each of the pre-driver ICs based on the feedback information, diagnostic information, and control input to the controller, e.g., external input indicating a desire to change the direction or speed of motors 204*a* and 204*b*. At step 420, the controller will send the switch control data over the SPI bus to the pre-driver ICs.

Figure 5:
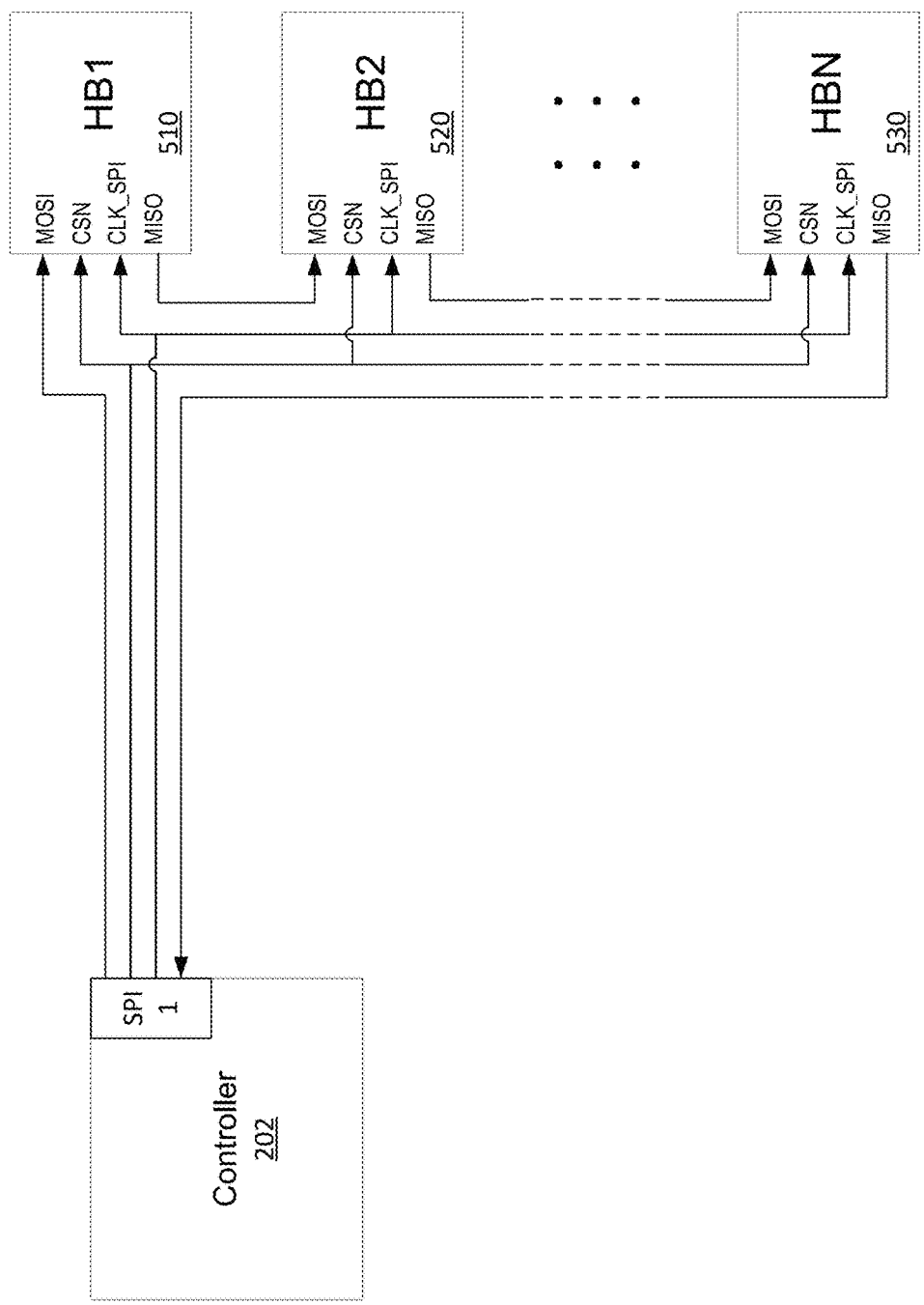
FIG. 5 illustrates a circuit for synchronizing the internal oscillators of half bridge drivers, in accordance with some embodiments.

FIG. 5 illustrates a circuit for synchronizing internal oscillators of half bridge drivers, in accordance with some embodiments. In some embodiments, rather than having three half-bridge drivers integrated into one pre-driver IC, a pre-driver IC can integrate one half-bridge driver having high side and low side drivers on each. For simplicity, these can be referred to as half-bridge drivers, however, it should be recognized that each will also contain other functionality (such as a data bus and synchronization logic) and can also be considered pre-driver ICs. FIG. 5 also illustrates that a multitude of half-bridge drivers can be chained together. The number of half-bridge drivers that can go on one chain is limited by the data rate of the data bus and length of the data being transmitted. Using other data bus architectures, the number of half-bridge drivers can be limited by other factors particular to those data busses. One advantage of an SPI bus is a minimizing of the number of connections from the microcontroller to the drivers. The internal oscillators of the half-bridge drivers can be synchronized using a process such as described above in conjunction with FIG. 3.

Although the half-bridges or motors or motor windings are not shown in FIG. 5 (and FIG. 6, discussed below), it should be understood that each of the half-bridge drivers will provide a high side and low side switching signal to the half-bridge switches which supply or inhibit power to a motor winding.

Figure 6:
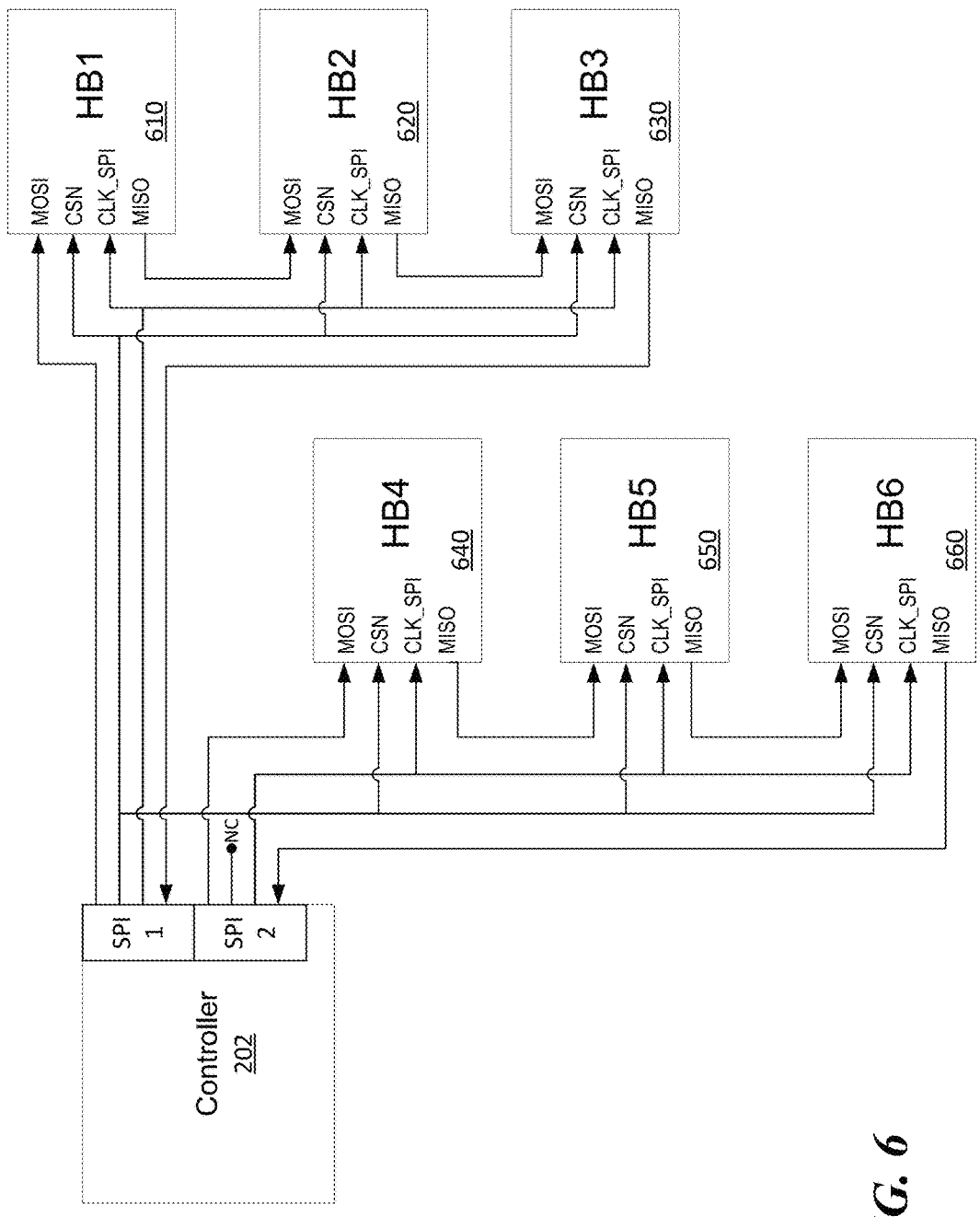
FIG. 6 illustrates a circuit for synchronizing the internal oscillators of half bridge drivers, in accordance with some embodiments.

FIG. 6 illustrates a circuit for synchronizing internal oscillators of half-bridge drivers, in accordance with some embodiments. If more half-bridge drivers are needed than the length of the data and data bus speed would allow in one chain, additional chains can be added. FIG. 6 is similar to FIG. 5, except that it illustrates how one could add another chain in another SPI bus, but still synchronize each of the internal oscillators to the same external reference. One of skill in the art will understand that additional chains can be added in a like manner. In such a configuration, to drive the switches for six windings, six half-bridge drivers could be used. Each half-bridge driver would be responsible for generating its own pulse modulated signal (such as a PWM signal) based on switch control data and an internal oscillator. In some embodiments, synchronization the six internal oscillators of each half-bridge driver can be synchronized.

In the configuration of FIG. 6, the SPI bus must carry all the data to and from each attached half-bridge driver within a single data frame. The amount of data that one data frame of the SPI bus can contain depends on the clock rate of the SPI bus, the frequency that the switch control data is updated, and length of the data sent to each device. In other words, a faster bus can transmit more data within a certain period of time. In some embodiments, all half-bridge drivers can be controlled on a single SPI bus. In some embodiments, additional SPI busses can be added as needed, such as the two SPI busses illustrated in FIG. 6. Switch logic controller 202 has a first SPI bus "SPI 1" and a second SPI bus "SPI 2." SPI 1 is connected to half bridge drivers 610, 620, and 630. SPI 2 is connected to half bridge drivers 640, 650, and 660. As illustrated, however, rather than using the SPI 2 CS signal on the second set of half bridge drivers, the SPI 1 CS signal is used so that all SPI busses share the same CS signal. The CS signal can be considered a synchronization signal which will signal synchronization logic in the half-bridge drivers to begin synchronization of the internal oscillators to an external clock references, such as the SPI clock.

In FIG. 6, for each of the SPI busses, the half-bridge drivers are daisy chained together. For example a data signal comes from microcontroller 202 master out slave in (MOSI) on SPI 1 into the MOSI signal of half-bridge driver 610. A data signal comes from half-bridge driver 610 on master in slave out (MISO) into MOSI of half-bridge driver 620. A data signal comes from half-bridge driver 620 on MISO into MOSI of half-bridge driver 630. A data signal comes from half-bridge driver 630 on MISO into MISO of microcontroller 202. One data frame from microcontroller 202 can contain data for each of the three half-bridge drivers. An increase in SPI clock frequency could allow for more data segments to be transmitted within each data frame, and could allow more than three half-bridge drivers to be chained together. Likewise, a decrease in SPI clock frequency could allow for less data segments to be transmitted within each data frame, and could therefore require one or more additional SPI busses from microcontroller 202 to achieve redundancy for a three-phase motor.

Although each of half-bridge drivers of FIG. 6 can share the chip select signal from SPI 1, the clock signal is particular to each bus and so is not shared. However, the internal clocks of each of the half-bridge drivers are all synchronized with each other. In other words, half-bridge drivers 610, 620, and 630 are synchronized with each other, and can be synchronized with each other as described above. Half-bridge drivers 640, 650, and 660 are also synchronized with each other. Further, Half-bridge drivers 610, 620, and 630 are synchronized with half-bridge drivers 640, 650, and 660.

Although FIG. 6 shows two chain configurations, each with three half-bridge drivers, it should be appreciated that each chain can have more or less half-bridge drivers independently from one another. For example, one chain can be 3 half-bridge drivers and the other chain could be 4 half-bridge drivers. Any combination of numbers of half-bridge drivers for each chain can be used.

Figure 7:
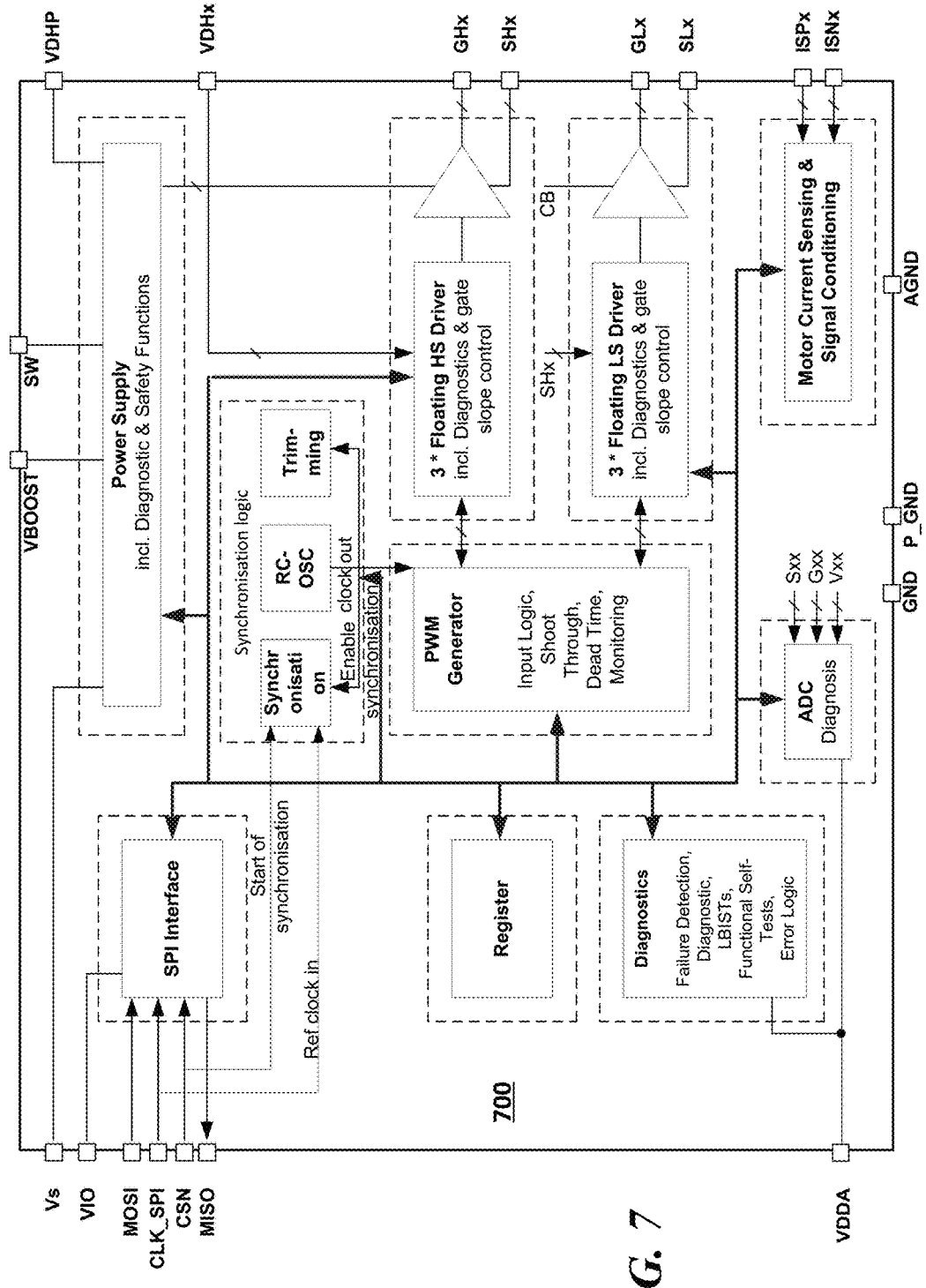
FIG. 7 illustrates a circuit for a half-bridge driver 600, in accordance with some embodiments.

FIG. 7 illustrates a circuit for a pre-driver IC 700, in accordance with some embodiments. Pre-driver 700 includes many of the features as the pre-driver ICs 203a and 203b of FIG. 2. As such, insofar as they contain the same or similar references, those will function the same as described above. One of skill in the art will understand the general operation of pre-driver 700 as a pre-driver device for a motor. Pre-driver 700 also includes synchronization logic which includes a synchronization block, oscillator RC-OSC, and trimming logic. The synchronization can use a reference clock (CLK_SPI) and chip select (CSN) signal from the SPI bus. When synchronization is triggered, the synchronization block can enable synchronization of the oscillators. As described above and in further detail below, the oscillators of each of the half-bridge drivers can be synchronized to the reference clock of the SPI bus when the CSN signal transitions following a dedicated sequence received on the SPI data bus.

Although the pre-driver IC of FIG. 7 illustrates three integrated half-bridge drivers, these can be separated into individual half-bridge drivers as depicted in FIGS. 5 and 6. For example, pre-driver IC 700 can, instead of integrating three half-bridge drivers, have one half-bridge driver integrated.

Figure 8:
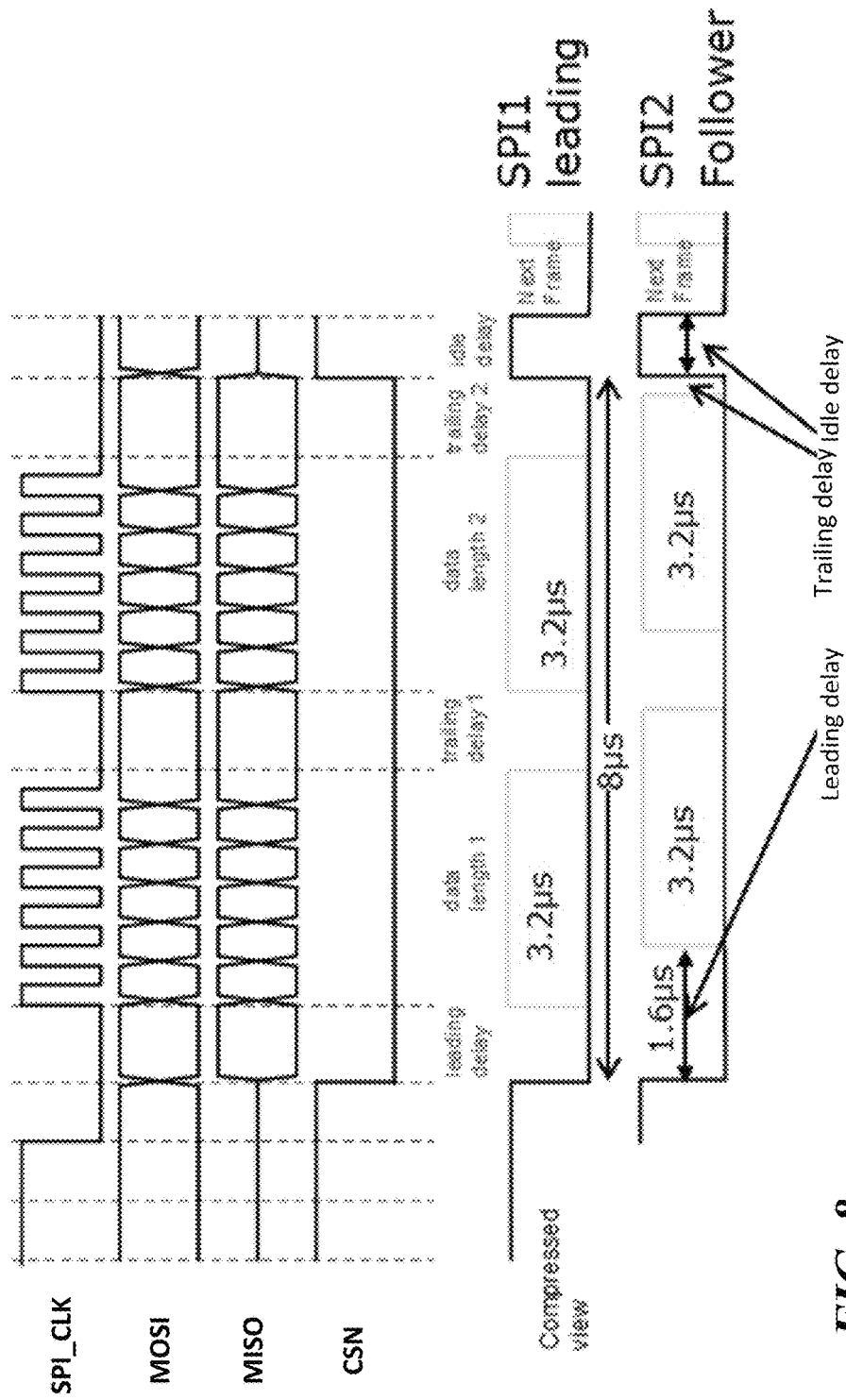
FIG. 8 illustrates a timing diagram relating to two distinct SPI busses, in accordance with some embodiments.

FIG. 8 illustrates a timing diagram relating to two distinct SPI busses, SPI 1 and SPI 2, in accordance with some embodiments. For example, FIG. 8 can relate to the timing of SPI 1 and SPI 2 of FIG. 6. At the bottom of FIG. 8, a data frame for SPI 1 and SPI 2 is illustrated. Above the data frame for SPI 1, a timing diagram of the SPI 1 bus is also illustrated. The timing diagram for SPI 2 (not shown) would be similar. The timing diagram includes the clock for SPI 1, the MOSI signal correlating to an output signal, the master receive slave transmit MISO signal correlating to an input signal, and the CSN. A timing relationship between the data frame and timing signals can establish delays associated with the signal. A leading delay is the time between a transition from high to low of the CSN signal and the start of the SPI CLK signal, which signifies when data begins. A trailing delay (trailing delay 1) is the time between one data packet and the next data packet within the frame. Another trailing delay (trailing delay 2 or simply, trailing delay) is the time between the end of the last data packet and when the CSN signals transitions from low to high, indicating the end of the data frame. An idle delay is a time that the CSN signal is high, preventing any transmitting/receiving on the SPI bus.

Each of the SPI 1 and SPI 2 busses can have leading delays, trailing delays, and idle delays. The SPI 1 and SPI 2 leading delays can be calculated and then subtracted from each other to find a leading delay difference. Likewise, the SPI 1 and SPI 2 trailing delays can be calculated and then subtracted from each other to find a trailing delay difference. Similarly, the SPI 1 and SPI 2 idle delays can be calculated and then subtracted from each other to find an idle delay difference. One or more of the leading delay difference, trailing delay difference, and idle delay difference can be used to synchronize the internal oscillators on the SPI 2 bus with the internal oscillators on the SPI 1 bus. For example, after receiving a synchronize command and on the falling edge of the chip select signal (which is received by both SPI busses at the same time), the SPI 2 internal oscillators can be synchronized to the SPI 2 bus clock offset by the leading delay difference, trailing delay difference, or idle delay difference, or some average of two or more of these. The internal oscillators of the half-bridge drivers on the SPI 1 bus can be synchronized to the SPI 1 bus clock. In some embodiments, after receiving a synchronize command and on the falling edge of the chip select signal, both the SPI 1 internal oscillators and SPI 2 internal oscillators can be synchronized to their respective SPI bus clock signal by offsetting their respective leading delay, trailing delay, or idle delay, or some average of two or more of these delays.

Figure 9:
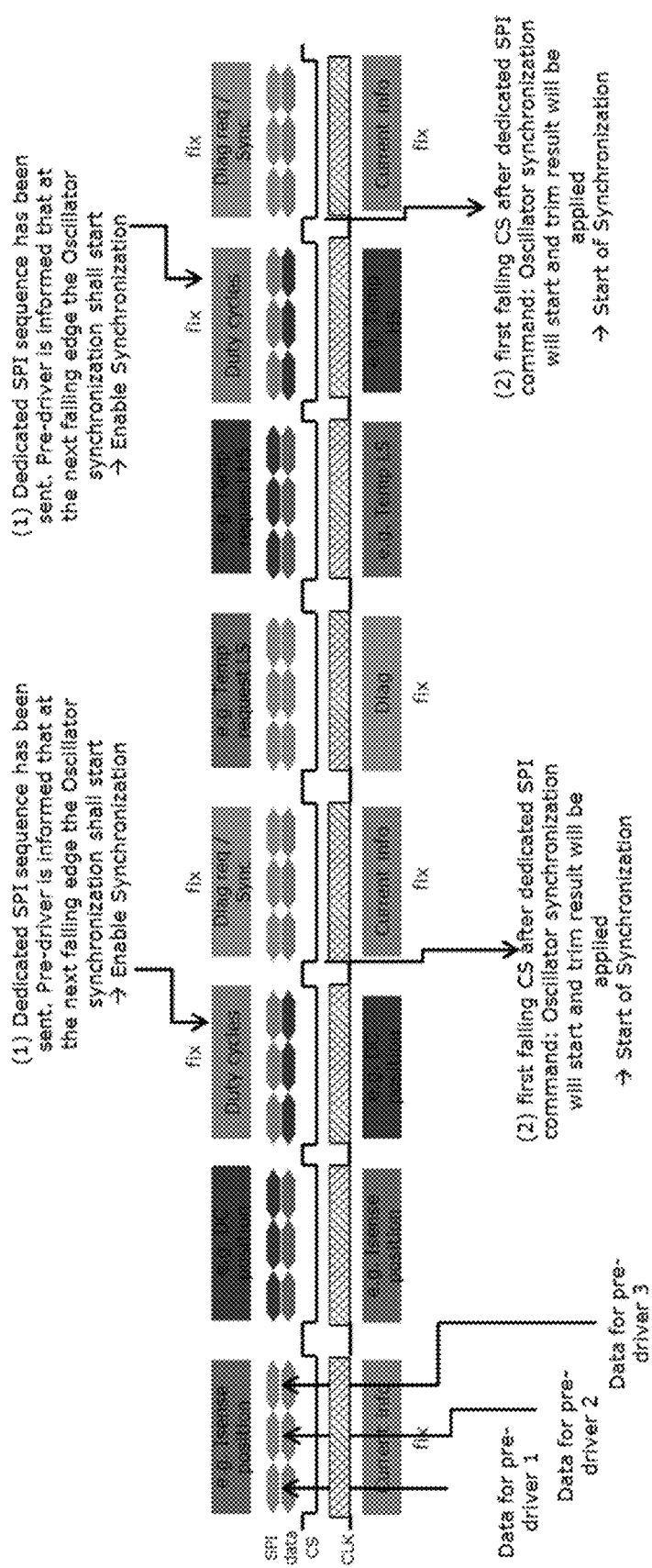
FIG. 9 illustrates a data stream for a switch controller, in accordance with some embodiments.

FIG. 9 illustrates a data stream for a motor controller in accordance with some embodiments. The top line represents the content of the data on the SPI bus out of a switch logic controller such as controller 202. For example, the data on the SPI bus out of the controller may include data requests such as requests for current sense position, direct current position, temperature sensor for the low side or high side drivers, or diagnostic requests, or data sent, such as duty cycle information for each of the pre-drivers. The second line, labelled SPI data, represents the data frames for each of the pre-drivers. The top sub-line of the SPI data line represents the data sent by the controller. The data for pre-driver 1 is in the first data frame; the data for pre-driver 2 is in the second data frame; and the data for pre-driver 3 is in the third data frame. The bottom sub-line of the SPI data line represents the data received by the controller. The data from pre-driver 1 is in the first data frame; the data from pre-driver 2 is in the second data frame; and the data from pre-driver 3 is in the third data frame. The third line, labelled CS, is the chip select signal. The fourth line, labeled CLK, is the SPI clock signal. The hatching in the SPI clock signal represents that the signal is rising and falling at a relatively fast clock rate. As seen, the SPI clock is only active when data is transmitting. The fifth line represents the content of the data on the SPI bus into the switch logic controller. For example, the data on the SPI bus into the controller can be responses from data requests such as current sense position, direct current position, temperature sensor for the low side or high side drivers, or diagnostic information or data provided for other reasons, such as current information in the pre-drivers for the duty cycle.

The data stream for FIG. 9 may relate to three half-bridge drivers serviced by one SPI bus, such as SPI 1 illustrated in FIGS. 5 and 6. A similar data stream can be produced for three half-bridge drivers serviced by another SPI bus, such as SPI 2 illustrated in FIG. 6.

At (1) of FIG. 9, a dedicated SPI sequence is be sent by the microcontroller, such as in the switch control data. The dedicated SPI sequence informs the pre-driver that at the next falling edge of the chip select signal, the internal oscillator synchronization should start. At (2) of FIG. 9, at the first falling edge of the chip select signal (acting as a synchronization signal) after the dedicated SPI command, oscillator synchronization starts and a trim offset is applied, such as described above in relation to FIG. 8, to offset the oscillator by an amount relating to the leading delay, trailing delay, or idle delay of the SPI bus. The synchronization sequence may be applied as often as deemed necessary. For example, in FIG. 9, the synchronization occurs after 12 data frames are transmitted on the SPI bus. Synchronization can be adjusted to be more or less often, at periodic or random intervals, or in response to external sensor information, such as controller temperature or motor diagnostic information.

In accordance with embodiments, a switch logic controller can control a redundant switching system, such as might be used for controlling two sets of motor windings. The redundancy can include an additional motor or can include additional windings within the same motor. Although the illustrations used herein apply to three-phase DC motors, the systems and methods can be modified to other phased DC motors, such as a two, four, five, or six-phase DC motor. The illustrative use of a three-phase DC motor and the specific mentioning of other motor arrangements are only given as an example and are not limiting.

Switch control data such as motor control data can be digitized in a switch logic controller and sent to pre-drivers, such as three-phase pre-driver ICs or three single-phase half-bridge drivers. Pulse-width modulated signals can be generated in the pre-driver ICs or half-bridge drivers based on the motor control commands and an internal oscillator. The internal oscillators of the pre-driver ICs or half-bridge drivers can be synchronized to an external reference clock. Synchronization can be accomplished by using a clock signal from a data bus as a reference signal and using a bus control signal as an activation signal. The bus control signal can have multiple purposes, i.e., function according to the bus design. To start synchronization, a synchronization data packet can be received by the pre-driver ICs or half-bridge drivers. Then, the bus control signal can be used to signal synchronization. Synchronization can apply a timing offset to the internal oscillator based on the bus clock signal. The timing offset can be calculated based delays that can be calculated based on the bus control signal and bus clock signal.

Accordingly, a switch control system with high robustness can be used to control switches while keeping the internal oscillators on which a pulse modulated signal (such as a PWM signal) is based, in sync with one another. One advantage of such a switch control system is the ability to provide redundancy at a smaller cost and with fewer control and feedback signals between a switch logic controller and pre-driver/half-bridge driver units. Another advantage of such a switch control system is to lessen shuddering, vibration, and torque effect between redundant motors and/or motor windings due to differences in internal oscillator frequencies.

Some embodiments include a drive circuit, including an internal oscillator and a pre-drive controller coupled to the internal oscillator. The pre-drive controller includes a switch control output configured to be coupled to a switch, where the pre-drive controller is configured to receive switch control data, receive a clock signal, receive a synchronization signal, synchronize the internal oscillator based on the clock signal and the synchronization signal, and generate a pulse modulated switching signal at the switch control output based on the switch control data and the internal oscillator. In some embodiments, the pre-drive controller is located on a substrate.

In some embodiments, the clock signal is a clock signal from a serial peripheral interface (SPI) bus and the synchronization signal is a chip select signal from an SPI bus. In some embodiments, the drive circuit includes switch driver circuit having an input coupled to the switch control output.

In some embodiments, the pre-drive controller can be configured to synchronize the internal oscillator by calculating a delay based on the synchronization signal and clock signal, and adjusting a phase of the internal oscillator based on the delay. In some embodiments, the pre-drive controller is a first controller and the drive circuit further includes a second controller configured according to the first controller. In some embodiments, the pulse modulated switching signal is a pulse width modulated switching signal. Some embodiments include the switch and in some embodiments the switch switches power to a motor. In some embodiments, the pre-drive controller is further configured to receive feedback from the switch, digitize the feedback, and provide the digitized feedback. In some embodiments including a switch, the switch control data is received from a switch logic controller and the digitized feedback is provided to the switch logic controller.

Some embodiments include a method, including receiving switch control data, receiving a clock signal, receiving a synchronization signal, synchronizing an internal oscillator based on the clock signal and the synchronization signal, generating a pulse modulated switching signal based on the switch control data and the internal oscillator, and providing the pulse modulated switching signal to a switch.

In some embodiments of a method, the clock signal is a clock signal from a serial peripheral interface (SPI) bus and the synchronization signal is a chip select signal from an SPI bus. In some embodiments of a method, providing the pulse modulated switching signal to a switch includes driving the switch with the pulse modulated switching signal. In some embodiments, the synchronizing includes, calculating a delay based on the synchronization signal and clock signal, adjusting a phase of the internal oscillator based on the delay. In some embodiments, the pulse modulated switching signal is a pulse width modulated switching signal. In some embodiments, the method includes switching power to a motor using the switch. In some embodiments of a method, the method also includes, receiving feedback from the switch, digitizing the feedback, and providing the digitized feedback. In some embodiments the switch control data is received from a switch logic controller, and the digitized feedback is provided to the switch logic controller.

Some embodiments include a system with a plurality of pre-driver controllers, where each of the plurality of pre-driver controllers includes an internal oscillator, an interface for a clock signal, an interface for a synchronization signal, and an interface for a data signal, configured to receive switch control data. The plurality of pre-driver controllers are each configured to generate a pulse modulated signal based on the switch control data and the internal oscillator, and synchronize the internal oscillator based on the clock signal and the synchronization signal. In some embodiments, the pre-drive controller is on a substrate of an integrated circuit.

Some embodiments of a system include that the clock signal interface of a first controller of the plurality of pre-driver controllers is coupled to the clock signal interface of a second controller of the plurality of pre-driver controllers, and that the synchronization signal interface of the first controller is coupled to the synchronization signal interface of the second controller.

Some embodiments of a system include a switch logic controller with an interface for the data signal coupled to the data signal interface of the plurality of pre-driver controllers, an interface for providing the clock signal coupled to the clock signal interface of the plurality of pre-driver controllers, and an interface for providing the synchronization signal coupled to the synchronization signal interface of the plurality of pre-driver controllers. The system can also include at least one driver for each of the plurality of pre-driver controllers, coupled respectively to the plurality of pre-driver controllers and configured to receive the respective pulse modulated signal The system can also include a switch for each of the at least one driver with a switching input respectively coupled to the at least one driver and configured to receive a respective switching signal from the respective at least one driver, wherein each respective switching signal is based on the respective pulse modulated signal. Some embodiments of a system include a motor, coupled to an output of each switch. In some embodiments each switch switches power to a motor winding. In some embodiments, wherein each of the plurality of pre-driver controllers is further configured to receive feedback from each respective switch, digitize the feedback, and provide the digitized feedback. Some embodiments can include that the switch control data is received from a switch control device, and the digitized feedback is provided to the switch control device.

In some embodiments of a system, the clock signal is a clock signal from a serial peripheral interface (SPI) bus and wherein the synchronization signal is a chip select signal from an SPI bus. In some embodiments, the pre-driver controller is further configured to synchronize the internal oscillator by calculating a delay based on the synchronization signal and clock signal, and adjusting a phase of the internal oscillator based on the delay. In some embodiments, the pulse modulated signal is a pulse width modulated signal Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A drive circuit, comprising:
an internal oscillator configured to provide an internal oscillating signal; and
a pre-drive controller coupled to the internal oscillator, the pre-drive controller comprising a plurality of switch control outputs each configured to be coupled to a switch, wherein the pre-drive controller is configured to:
receive, on a first input of a data bus, digital switch control data from a motor controller, the digital switch control data comprising duty cycle information for a multiphase motor, receive, on a clock signal input of the data bus, a clock signal,
receive, on a second input of the data bus, a synchronization signal,
upon receiving the synchronization signal on the second input, synchronize the internal oscillator based on a first timing difference between a first edge and a second edge of the clock signal, or based on a second timing difference and a third timing difference, the second timing difference being a timing difference between a third edge of the clock signal and an edge of the synchronization signal, and the third timing difference being a timing difference between a fourth edge of the clock signal and the edge of the synchronization signal, and
generate a pulse modulated switching signal for each phase of the multiphase motor at a corresponding one of the plurality of switch control outputs based on the digital switch control data and the internal oscillating signal.

2. The drive circuit of claim 1, wherein the clock signal is a clock signal from a serial peripheral interface (SPI) bus and wherein the synchronization signal is a chip select signal from the SPI bus.

3. The drive circuit of claim 1, further comprising a plurality of switch driver circuits each having an input coupled to a corresponding one of the plurality of switch control outputs.

4. The drive circuit of claim 1, wherein the pre-drive controller comprises a synchronization circuit configured to synchronize the internal oscillator by:
calculating a delay between a rising edge or falling edge of the synchronization signal and a falling edge or rising edge of the clock signal, respectively; and
adjusting a phase of the internal oscillator by offsetting the internal oscillating signal by the delay.

5. The drive circuit of claim 1, wherein the pre-drive controller is a first controller and the internal oscillator is a first internal oscillator; and the drive circuit further comprises a second controller configured according to the first controller and a second internal oscillator coupled to the second controller, wherein, after synchronizing the second internal oscillator, a phase of the second internal oscillator is substantially the same as a phase of the first internal oscillator.

6. The drive circuit of claim 1, wherein the pulse modulated switching signal is a pulse width modulated switching signal.

7. The drive circuit of claim 1, further comprising a plurality of switches, wherein each switch of the plurality of switches is coupled to a corresponding one of the plurality of switch control outputs.

8. The drive circuit of claim 7, wherein each switch switches power to a phase of the multiphase motor.

9. The drive circuit of claim 1, wherein the pre-drive controller is further configured to:
receive analog feedback from a switch receiving the pulse modulated switching signal;
digitize the feedback; and
provide the digitized feedback to the motor controller.

10. The drive circuit of claim 1, wherein the pre-drive controller is located on a substrate of an integrated circuit.

11. The drive circuit of claim 1, wherein the synchronization signal is a second synchronization signal, wherein the pre-drive controller is further configured to receive, prior to receiving the second synchronization signal on the second input, a first synchronization signal on the first input, the first synchronization signal notifying the pre-drive controller that the second synchronization signal is a triggering signal to trigger synchronization.

12. A method, comprising:
receiving, at a data input of a pre-drive controller, digital switch control data from a motor controller, the digital switch control data comprising duty cycle information for a first phase of a multiphase motor;
receiving, at the pre-drive controller, a clock signal;
receiving, at the pre-drive controller, a synchronization signal;
upon receiving the synchronization signal, synchronizing an internal oscillator of the pre-drive controller that provides an internal oscillating signal, based on a first timing difference between a first edge and a second edge of the clock signal or based on a second timing difference and a third timing difference, the second timing difference being a timing difference between a third edge of the clock signal and an edge of the synchronization signal, and the third timing difference being a timing difference between a fourth edge of the clock signal and the edge of the synchronization signal;
generating a pulse modulated switching signal for the first phase of the multiphase motor based on the digital switch control data and the internal oscillating signal; and
providing the pulse modulated switching signal to a switch.

13. The method of claim 12, wherein the clock signal is a clock signal from a serial peripheral interface (SPI) bus, wherein the synchronization signal is a chip select signal from the SPI bus, and wherein the digital switch control data is received over the SPI bus.

14. The method of claim 12, wherein providing the pulse modulated switching signal comprises driving a switching input of the switch with the pulse modulated switching signal.

15. The method of claim 12, wherein synchronizing the internal oscillator comprises:
calculating a delay between a rising edge or falling edge of the synchronization signal and a falling edge or rising edge of the clock signal, respectively; and
adjusting a phase of the internal oscillating signal provided by the internal oscillator by offsetting the internal oscillating signal by the delay.

16. The method of claim 12, wherein the pulse modulated switching signal is a pulse width modulated switching signal.

17. The method of claim 12, further comprising:
receiving feedback from the switch;
digitizing the feedback; and
providing the digitized feedback to the motor controller.

18. The method of claim 12, wherein the pre-drive controller is a first pre-drive controller, the method further comprising:
receiving, at a second pre-drive controller, the digital switch control data from the motor controller for the first phase of the multiphase motor;
receiving, at the second pre-drive controller, the clock signal;
receiving, at the second pre-drive controller, the synchronization signal;
upon receiving the synchronization signal, synchronizing an internal oscillator of the second pre-drive controller based on a fourth timing difference in the second pre-drive controller between a fifth edge and a sixth edge of the clock signal or based on a fifth timing difference and a sixth timing difference, the fifth timing difference being a timing difference between a seventh edge of the clock signal and a second edge of the synchronization signal, and the sixth timing difference being a timing difference between an eighth edge of the clock signal and the second edge of the synchronization signal;

generating a second pulse modulated switching signal for the first phase of the multiphase motor based on the digital switch control data received at the second pre-drive controller and an internal oscillating signal provided by an internal oscillator of the second pre-drive controller; and providing the second pulse modulated switching signal to a second switch, wherein the pulse modulated switching signal of the first pre-drive controller is for a first set of motor windings for the multiphase motor, and wherein the pulse modulated switching signal of the second pre-drive controller is for a second set of motor windings for the multiphase motor, wherein, after synchronizing the internal oscillator of the second pre-drive controller, a phase of the internal oscillator of the second pre-drive controller is substantially the same as a phase of the internal oscillator of the first pre-drive controller.

19. The method of claim 12, wherein the synchronization signal is a second synchronization signal, the method further comprising:

prior to receiving the second synchronization signal, receiving a first synchronization signal on the data input, the first synchronization signal providing that the second synchronization signal is a triggering signal to trigger synchronization.

20. A system comprising:

a plurality of pre-driver controllers, wherein each pre-driver controller of the plurality of pre-driver controllers comprises:
an internal oscillator configured to provide an internal oscillating signal,
a first input interface for a clock signal,
a second input interface for a synchronization signal, and
a data interface for a data signal, configured to receive digital switch control data, the digital switch control data comprising duty cycle information for a switched load, wherein each pre-driver controller of the plurality of pre-driver controllers is configured to:
generate a pulse modulated signal based on the digital switch control data and the internal oscillating signal; and
upon receiving the synchronization signal, synchronize the internal oscillator based on a first timing difference between a first edge and a second edge of the clock signal or based on a second timing difference and a third timing difference, the second timing difference being a timing difference between a third edge of the clock signal and an edge of the synchronization signal, and the third timing difference being a timing difference between a fourth edge of the clock signal and the edge of the synchronization signal.

21. The system of claim 20, wherein a first input interface of a first pre-driver controller of the plurality of pre-driver controllers is coupled to a first input interface of a second pre-driver controller of the plurality of pre-driver controllers, and wherein a second input interface of the first pre-driver controller is coupled to a second input interface of the second pre-driver controller.

22. The system of claim 21, wherein the clock signal is a clock signal from a serial peripheral interface (SPI) bus, wherein the synchronization signal is a chip select signal from the SPI bus, and wherein the data interface comprises a data input interface and a data output interface, wherein the data output interface of the first pre-driver controller is coupled to the data input interface of the second pre-driver controller.

23. The system of claim 21, wherein synchronizing the internal oscillator comprises:
calculating a delay between a rising edge or falling edge of the synchronization signal and a falling edge or rising edge of the clock signal, respectively; and
adjusting a phase of the internal oscillating signal by offsetting the internal oscillating signal by the delay.

24. The system of claim 20, wherein the system further comprises:
a motor controller comprising:
a data interface for the data signal, the data interface coupled to the data interface of each pre-driver controller of the plurality of pre-driver controllers,
a first output interface for providing the clock signal, the first output interface coupled to the first input interface of each pre-driver controller of the plurality of pre-driver controllers, and
a second output interface for providing the synchronization signal, the second output interface coupled to the second input interface of each pre-driver controller of the plurality of pre-driver controllers;
at least one driver for each pre-driver controller of the plurality of pre-driver controllers, coupled respectively to each pre-driver controller of the plurality of pre-driver controllers and configured to receive a respective pulse modulated signal and output a respective switching signal based on the respective pulse modulated signal; and
a switch for each driver of the at least one driver, each switch having a switching input respectively coupled to the at least one driver, each switch configured to receive the respective switching signal from the respective driver of the at least one driver.

25. The system of claim 24, wherein the system further comprises:
a multiphase motor, coupled to an output of each switch.

26. The system of claim 25, wherein each switch switches power to a motor winding of the multiphase motor.

27. The system of claim 24, wherein each pre-driver controller of the plurality of pre-driver controllers is further configured to:
receive feedback from each respective switch;
digitize the feedback; and
provide the digitized feedback to the motor controller.

28. The system of claim 20, wherein the plurality of pre-drive controllers is on a substrate of an integrated circuit.

29. The system of claim 20, wherein the pulse modulated signal is a pulse width modulated signal.

30. The system of claim 20, wherein each pre-driver controller of the plurality of pre-driver controllers is further configured to:
prior to receiving the synchronization signal, receive a first synchronization signal on the data interface, the first synchronization signal providing that the subsequent synchronization signal triggers synchronization.

* * * * *